United States Patent [19]
Yamazaki et al.

[11] Patent Number: 5,432,314
[45] Date of Patent: Jul. 11, 1995

[54] TRANSPARENT MASK PLATE FOR CHARGED PARTICLE BEAM EXPOSURE APPARATUS AND CHARGED PARTICLE BEAM EXPOSURE PROCESS USING THE TRANSPARENT MASK PLATE

[75] Inventors: Satoru Yamazaki; Yoshihisa Oae; Kiichi Sakamoto; Akio Yamada, all of Kawasaki, Japan

[73] Assignee: Fujitsu Limited, Kawasaki, Japan

[21] Appl. No.: 109,263

[22] Filed: Aug. 20, 1993

[30] Foreign Application Priority Data

Aug. 20, 1992 [JP] Japan .................... 4-221524

[51] Int. Cl.⁶ .................... H01J 37/04; G03F 9/00
[52] U.S. Cl. .................... 219/121.25; 492.2/430; 430/5
[58] Field of Search ............ 430/5; 250/492.2, 492.22, 250/492.3, 492.21; 219/121.25

[56] References Cited

U.S. PATENT DOCUMENTS

| | | | |
|---|---|---|---|
| 4,647,782 | 3/1987 | Wada et al. | 250/492.2 |
| 5,036,209 | 7/1991 | Kataoka et al. | 250/492.2 |
| 5,105,089 | 4/1992 | Yamada | 250/492.2 |
| 5,173,582 | 12/1992 | Sakamoto et al. | 219/121.25 |
| 5,288,567 | 2/1994 | Sakamoto et al. | 430/5 |

Primary Examiner—Geoffrey S. Evans
Attorney, Agent, or Firm—Staas & Halsey

[57] ABSTRACT

A transparent mask plate used in a charged particle beam exposure apparatus includes a base plate, an exposure pattern area, and a calibration area. The exposure pattern area is formed in the base plate and has a plurality of transparent patterns for shaping a cross section of a charged particle beam into a block pattern. The calibration area is formed in the base plate, and has a plurality of transparent patterns used for obtaining a condition for deflecting the charged particle beam. The plurality of transparent patterns formed in the calibration area are arranged at the same pitch as the plurality of transparent patterns formed in the exposure pattern area. Each of the plurality of transparent patterns formed in the calibration area corresponds to one of the plurality of transparent patterns formed in the exposure pattern area.

20 Claims, 14 Drawing Sheets

TRANSPARENT MASK PLATE FOR CHARGED PARTICLE BEAM EXPOSURE APPARATUS AND CHARGED PARTICLE BEAM EXPOSURE PROCESS USING THE TRANSPARENT MASK PLATE

BACKGROUND OF THE INVENTION

1. Field of the Invention

The present invention generally relates to a charged particle beam exposure apparatus that performs an exposure process using a charged particle beam, such as an electronic beam or an ion beam. More particularly, the present invention is concerned with a transparent mask (block mask or stencil mask) plate used in a case where the exposure is performed using the cross section of the charged particle beam shaped into a transparent pattern (block pattern).

2. Description of the Prior Art

Recently, there has been considerable activity in the research and development of a charged particle beam exposure apparatus, particularly an electron beam exposure apparatus. There are several known types of electron beam exposure apparatuses. An electron beam exposure apparatus performs a block exposure process in which the cross section of the electron beam is shaped into a block pattern by means of a transparent mask plate. Such the block exposure process is suitable for producing an LSI having a large number of identical patterns.

In order to realize highly-precise block exposure, it is necessary to accurately deflect an electron beam that has been shaped into a rectangle. More specifically, the electron beam shaped into a rectangle is deflected so that three reference points of the electron beam shaped into a rectangle are located at reference points of a selected one of transparent patterns. Then, the electron beam is further deflected to the optical axis of the undeflected electron beam. Hence, the electron beam is caused to pass through a diaphragm aperture without being shadowed by the aperture.

In order to perform the above deflection control, it is necessary to previously study the relationship between a mask deflector system and deflected positions of the electron beam. As will be described in detail later, a transparent mask has a calibration area in addition to exposure pattern areas arranged in rows and columns. A plurality of identical transparent patterns are formed in the calibration area and are arranged at predetermined constant intervals. A calibration process is performed using the transparent patterns in the calibration area in order to obtain the relationship between the mask deflector system and the deflection caused thereby to the electron beam.

Conventionally, the number of transparent patterns formed in the calibration area is much smaller than that of transparent patterns formed in each of the transparent pattern areas. Further, the transparent patterns in the calibration area are arranged with a pitch different from that of the transparent patterns in the exposure pattern areas. Hence, an interpolation process is carried out on the basis of the obtained relationship in order to obtain a degree of deflection of the electron beam when the electron beam is deflected to a position other than the positions of the calibration areas.

In the interpolation process, a straight or curved characteristic line connecting the reference points is used. The characteristic line shows a mask-deflector variation condition between the two reference points. However, in actuality, such a straight or curved characteristic line does not match the actual mask deflector condition. Hence, it is very difficult to accurately deflect the electron beam to a desired intermediate position between the reference points, and an error in the position of the deflected beam occurs. This prevents highly-precise exposure.

SUMMARY OF THE INVENTION

It is a general object of the present invention to provide a transparent mask plate for a charged particle beam exposure apparatus in which the above disadvantage is eliminated.

A more specific object of the present invention is to provide a transparent mask plate for a charged particle beam exposure apparatus in which a charged particle beam can be accurately deflected so that the beam can be positioned at a selected transparent pattern for exposure.

The above objects of the present invention are achieved by a transparent mask plate used in a charged particle beam exposure apparatus comprising: a base plate; an exposure pattern area formed in the base plate, the exposure pattern area having a plurality of transparent patterns for shaping a cross section of a charged particle beam into a block pattern; and a calibration area formed in the base plate, the calibration area having a plurality of transparent patterns used for obtaining a condition for deflecting the charged particle beam, the plurality of transparent patterns formed in the calibration area being arranged at the same pitch as the plurality of transparent patterns formed in the exposure pattern area, each of the plurality of transparent patterns formed in the calibration area corresponding to one of the plurality of transparent patterns formed in the exposure pattern area.

The above objects of the present invention are also achieved by a transparent mask plate used in a charged particle beam exposure apparatus comprising: a base plate; an exposure pattern area formed in the base plate, the exposure pattern area having a plurality of transparent patterns for shaping a cross section of a charged particle beam into a block pattern; and a plurality of calibration areas formed in the base plate, each of the calibration areas having a plurality of transparent patterns used to calibrate a degree of deflection of the charged particle beam, the plurality of transparent patterns formed in each of the calibration areas being arranged with a pitch greater than that of the plurality of transparent patterns formed in the exposure pattern area, each of the plurality of transparent patterns formed in each of the calibration areas corresponding to one of the plurality of transparent patterns formed in the exposure pattern area.

Another object of the present invention is to provide a charged particle beam exposure method using the above transparent mask plate.

This object of the present invention is achieved by a charged particle beam exposure method for projecting a charged particle beam onto a wafer, the method comprising the steps of: (a) shaping a cross section of the charged particle beam into a rectangle; (b) deflecting the charged particle beam to a calibration area of a transparent mask plate as configured above; (c) obtaining a condition for deflecting the charged particle beam by detecting the charged particle beam passing through the calibration area of the transparent mask; and (d) deflecting the charged particle beam to an exposure pattern area of the transparent mask plate on the basis of the condition for deflecting the charged particle beam obtained in the step (c).

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

In order to facilitate better understanding of the present invention, a description will now be given of an electron beam exposure apparatus using a conventional transparent mask plate.

Figure 1:
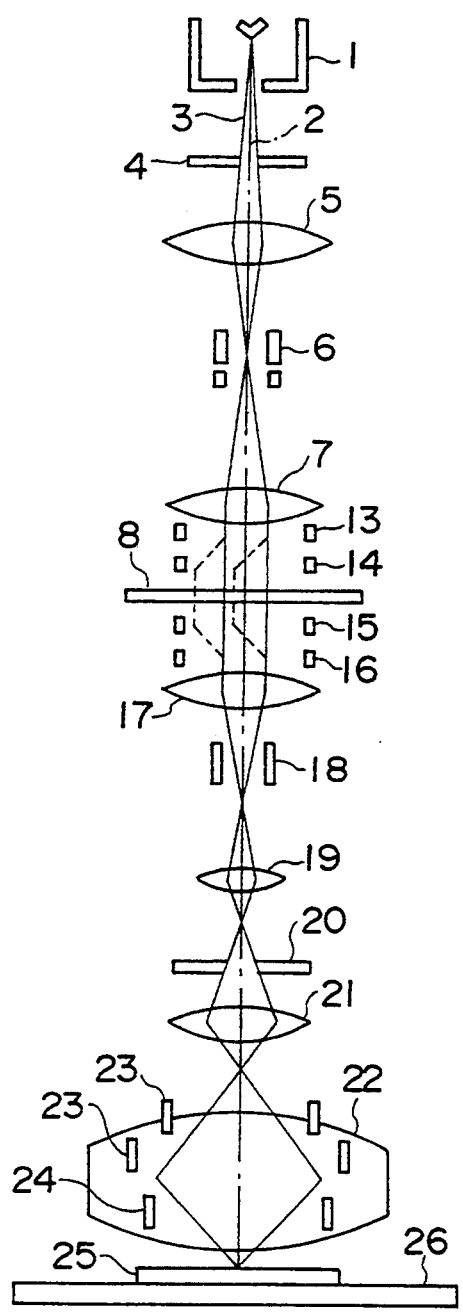
FIG. 1 is a diagram of an electron beam exposure apparatus.

FIG. 1 shows such an electron beam exposure apparatus, more particularly, an optical system of the apparatus. As shown in FIG. 1, the apparatus includes an electron gun 1 that emits an electron beam, the electron beam being propagated along an optical axis 2. A shaping aperture 3 shapes the cross section of the electron beam into a rectangle. An electromagnetic lens 5 focuses the shaped electron beam from the shaping aperture 4. A deflector 6 deflects the electron beam so that the rectangular cross-section can be varied. An electromagnetic lens 7 collimates the electron beam from the deflector 6 for the variable-rectangle shaping.

Figure 2:
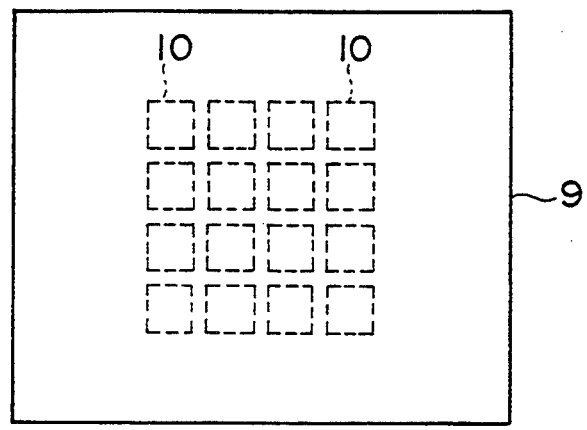
FIG. 2 is a plan view of a conventional transparent mask plate.

A conventional transparent mask plate 8 is used to shape the cross-section of the electron beam. FIG. 2 is a plan view of the conventional transparent mask plate 8, which is made up of a base plate 9 and a plurality of exposure pattern areas 10 arranged with a predetermined pitch in rows and columns. Each of the areas 10 has dimensions within which the electron beam can be deflected in a case where the transparent mask plate 8 is fixed at a predetermined position.

Figure 3:
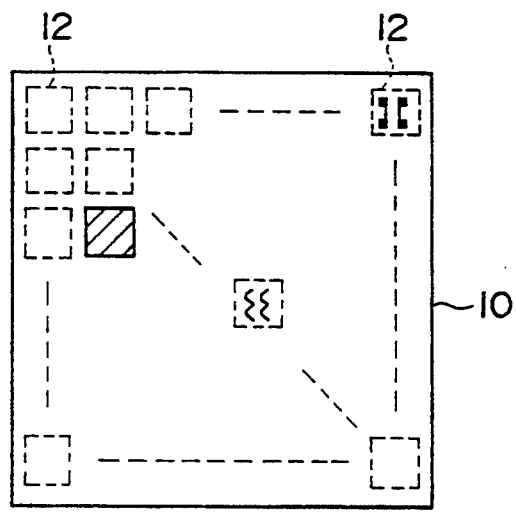
FIG. 3 is a plan view of an enlarged view of an exposure area shown in FIG. 1.

FIG. 3 is an enlarged plan view of one of the areas 10. As shown in FIG. 3, each of the exposure pattern areas 10 has transparent patterns 12 arranged in rows and columns.

Returning now to FIG. 1, mask deflectors 13–16 are used to shape the cross section of the collimated electron beam from the electromagnetic lens 7 into the shape of the transparent patterns 12, that is, they are used to shape the cross section of the collimated electron beam into a block pattern. The mask deflectors 13–16 form a mask deflector system. More concretely, the mask deflectors 13 and 14 deflect the electron beam 3 so that it is positioned at a selected one of the transparent patterns 12. The mask deflectors 15 and 16 deflect the electron beam 3 shaped into a block pattern by means of the deflectors 13 and 14 so that the shaped electron beam 3 is returned to the optical axis when the electron beam is not deflected at all thereby. The mask deflectors 13 and 16 are located at positions having a mirror-symmetry relation. Similarly, the mask deflectors 14 and 15 are located at positions having a mirror-symmetry relation.

An electromagnetic lens 17 focuses the electron beam 3 collimated by the electromagnetic lens 7. The electromagnetic lenses 7 and 17 are symmetrical to each other with respect to the block mask 8. A blanking electrode 18 controls passage of the electron beam 3. A reduction lens 19 reduces an electron beam image. Focusing lenses 21 and 22 form the electron beam image on a wafer 25 placed on a wafer stage 26. A diaphragm aperture 20 is located between the lens 19 and the lens 21. A main deflector 23 deflects the electron beam 3 towards a sub-deflection area. A sub deflector 24 deflects the electron beam to an exposure position in the sub-deflection area.

The above-mentioned electron beam exposure apparatus is suitable for an LSI device having identical patterns, such as a DRAM (Dynamic Random Access Memory). The electron beam is shaped into a block pattern corresponding to the identical patterns formed in the LSI device, and the identical patterns are repeatedly exposed using the shaped electron beam. Hence, it is possible to reduce the time necessary for the exposure process.

In order to accurately perform the block exposure, it is necessary to accurately deflect the electron beam 3 shaped into a rectangle so that three reference points of the shaped electron beam 3 are located at the reference points of a selected transparent pattern, and to again deflect the electron beam 3 so that it can be propagated along the optical axis of the original trajectory of the electron beam 3 in the undeflected state. Hence, it becomes possible to cause the electron beam 3 to pass through the diaphragm aperture 20 without being obstructed by the diaphragm aperture 20.

In order to perform the above-mentioned deflection control, it is necessary to previously obtain the relationship between the mask deflector condition and the deflected positions of the electron beam 3. The mask deflector condition determines the magnitudes of deflection signals applied to the mask deflectors 13–16.

Figure 4:
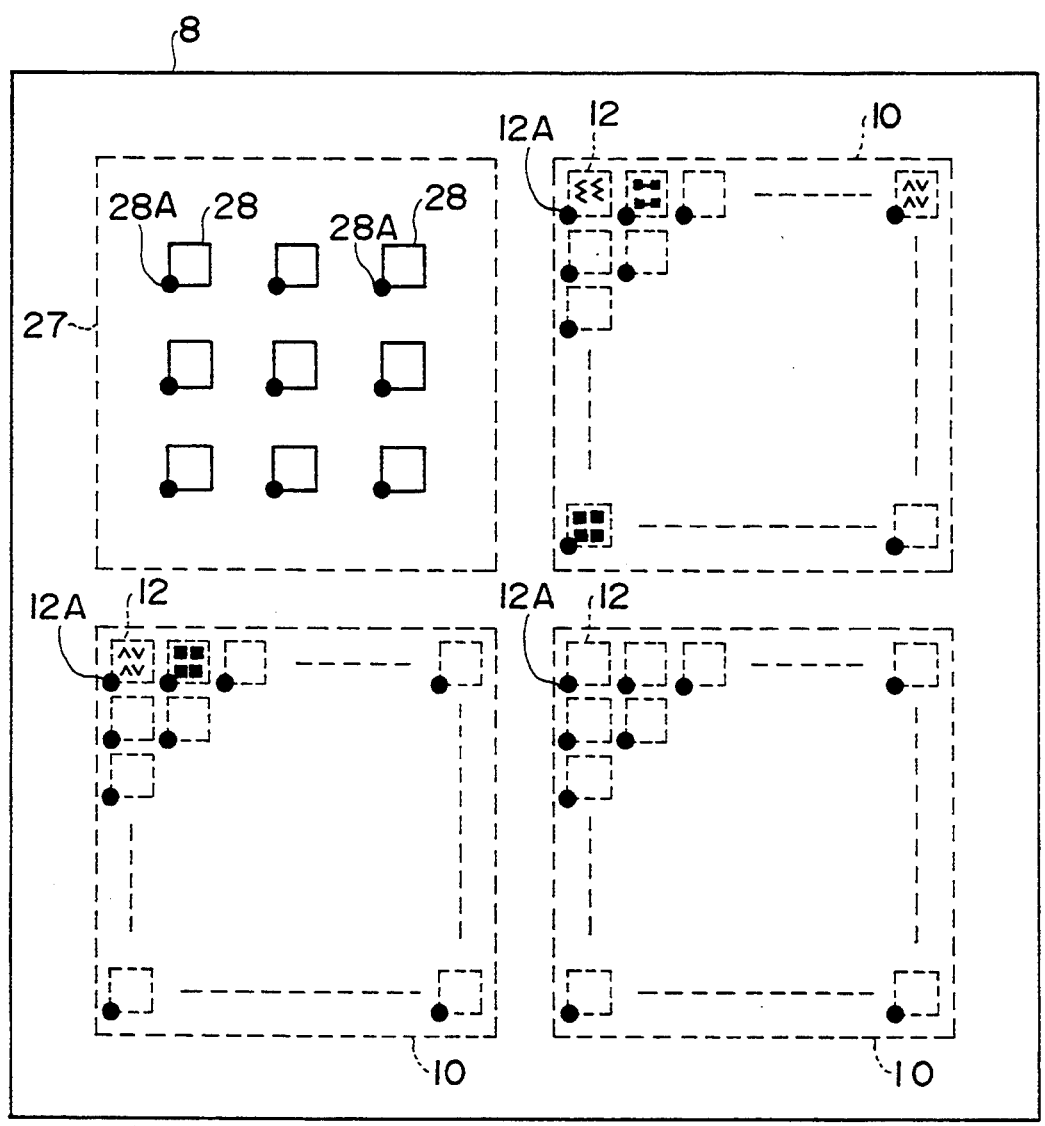
FIG. 4 is a plan view of a conventional transparent mask plate having a calibration area.

Conventionally, as shown in FIG. 4, the transparent mask plate 8 has a calibration area 27, in which transparent patterns 28 having identical shapes, such as rectangular transparent patterns, are arranged in rows and columns at constant intervals. Information concerning the positions and sizes of the transparent patterns 28 is obtained previously. The calibration process is performed using the transparent patterns 28 in order to obtain the relationship between the mask deflector condition and the deflected positions of the electron beam 3.

Figure 5:
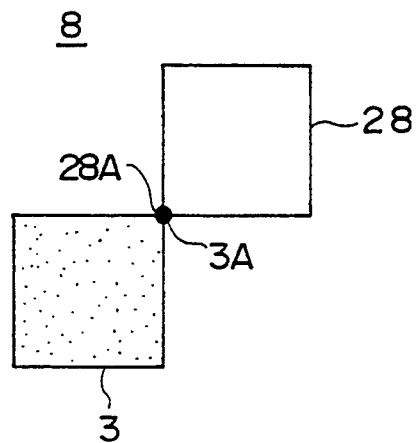
FIG. 5 is a plan view illustrating a calibration process.

More particularly, the following process is carried out for each of the transparent patterns 28. A reference point 28A of the transparent pattern 28 of interest is scanned by the electron beam 3 shaped into a rectangle, and the magnitude of a current of the electron beam 3 passing through the transparent pattern 28 is detected on the wafer 25. As shown in FIG. 5, the magnitudes of the deflection signals are adjusted so that a reference point 3A of the electron beam 3 shaped into a rectangle is located at the reference point 28A of the transparent pattern 28. The magnitudes of the deflection signals obtained at this time define the mask deflector condition.

Next, a mask deflector condition necessary to deflect the electron beam 3 to an intermediate point between the reference points 28A of the adjacent transparent patterns 28 is obtained by an interpolation process using the mask defector condition obtained by the abovementioned process shown in FIG. 5. In the interpolation process, a straight or curved characteristic line connecting the adjacent reference points 28A to each other is used.

The number of transparent patterns 28 formed in the calibration area 27 is much smaller than that of transparent patterns 12 formed in each of the transparent pattern areas 10. Further, the transparent patterns 28 in the calibration area 27 are arranged with a pitch different from that of the transparent patterns 12 in each of the exposure pattern areas 10. Hence, the positions of the reference points 12A of the transparent patterns 12 in each of the exposure pattern areas 10 do not match the positions of the reference points 28A of the transparent patterns 28 in the calibration area 27. When the electron beam 3 should be deflected to an intermediate position between adjacent reference patterns 28A, the mask deflector condition obtained in the process shown in FIG. 5 cannot be used. In order to obtain the mask deflector condition for such an intermediate point, the interpolation process is employed.

However, in actuality, such a straight or curved characteristic line does not match the actual mask deflector condition. Hence, it is very difficult to accurately deflect the electron beam 3 to a desired intermediate position, and an error in the position of the deflected beam occurs. This prevents highlyprecise exposure.

The present invention is intended to overcome the above disadvantage of the prior art.

Figure 6:
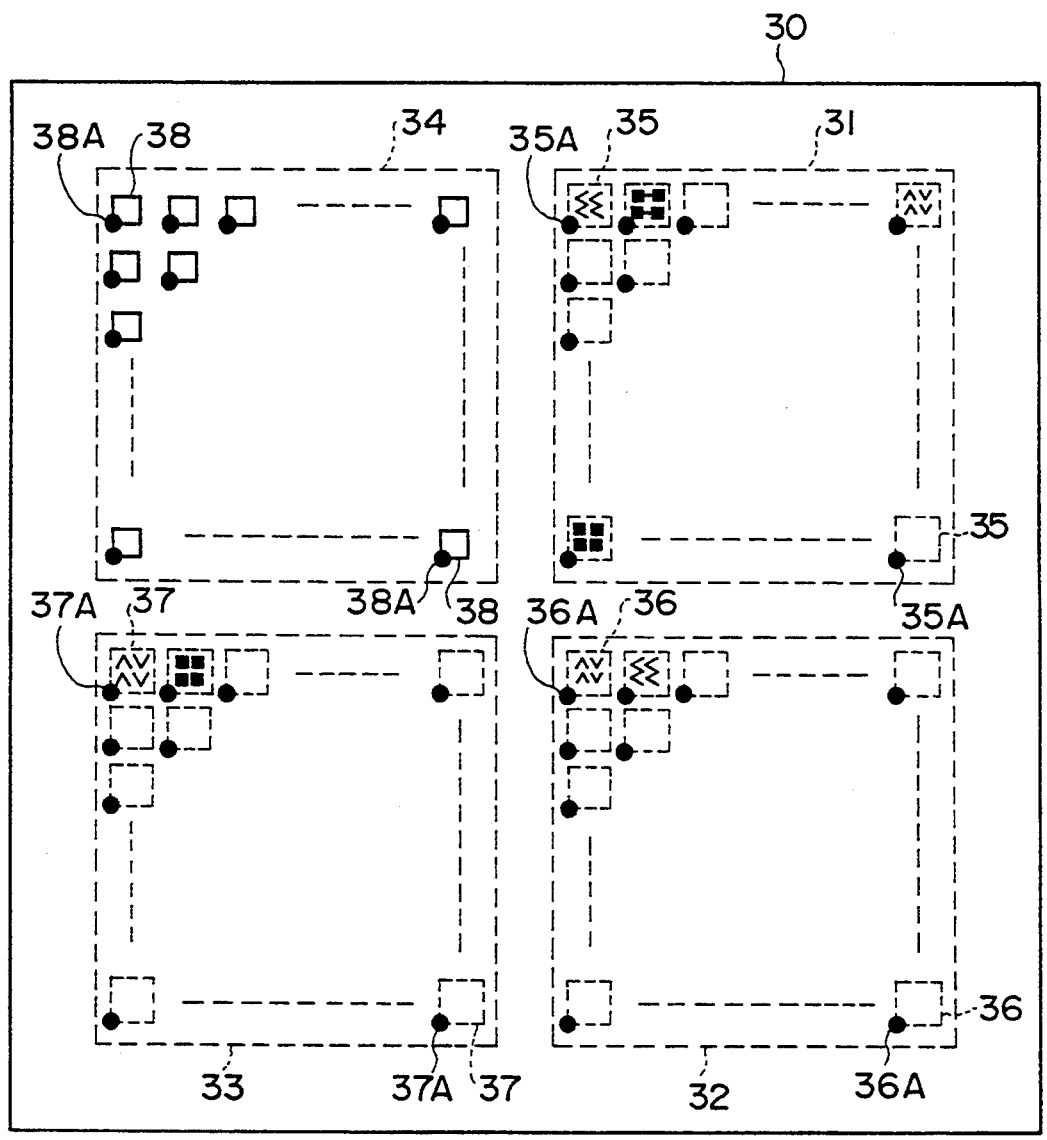
FIG. 6 is a plan view of a transparent mask plate according to a first embodiment of the present invention.

FIG. 6 is a plan view of a transparent mask plate according to a first embodiment of the present invention. The transparent mask plate is used instead of the transparent mask plate 8 shown in FIG. 1. The transparent mask plate includes a base plate 30, exposure pattern areas 31, 32 and 33, and a calibration area 34 related to the exposure pattern areas 31, 32 and 33. A plurality of transparent patterns 35 arranged in rows and columns are formed in the exposure pattern area 31. A reference number 35A indicates a reference point of each of the transparent patterns 35. A plurality of transparent patterns 36 arranged in rows and columns are formed in the exposure pattern area 32. A reference number 36A indicates a reference point of each of the transparent patterns 36. A plurality of transparent patterns 37 arranged in rows and columns are formed in the exposure pattern area 33. A reference number 37A indicates a reference point of each of the transparent patterns 37. A plurality of transparent patterns 38 arranged in rows and columns are formed in the calibration area 34. A reference number 38A indicates a reference point of each of the transparent patterns 38.

The transparent patterns 35, 36 and 37 respectively formed in the exposure pattern areas 31, 32 and 33 are arranged at an identical pitch. The transparent patterns 38 in the calibration area 34 are arranged at the same pitch as that of the transparent patterns 35, 36 and 37. Each of the transparent patterns 38 corresponds to one of the transparent patterns 35, one of the transparent patterns 36 and one of the transparent patterns 37. Further, the reference points 38A of the transparent patterns 38 in the calibration area 34 correspond to the reference points 35A, 36A and 37A of the transparent patterns 35, 36 and 37. Hence, the mask deflector conditions respectively obtained for the transparent patterns 38 in the calibration area 34 can be applied to the transparent patterns 35, 36 and 36 without modification. For example, when one of the transparent patterns 35 is selected, the mask deflector condition on the corresponding transparent pattern 38 having the same row and column as the selected transparent pattern 35 is used, and the electron beam 3 is deflected on the basis of the above mask deflector condition. For this purpose, the mask deflector conditions respectively obtained for the transparent patterns are stored in connection with the corresponding transparent patterns 35, 36 and 37.

Figure 7:
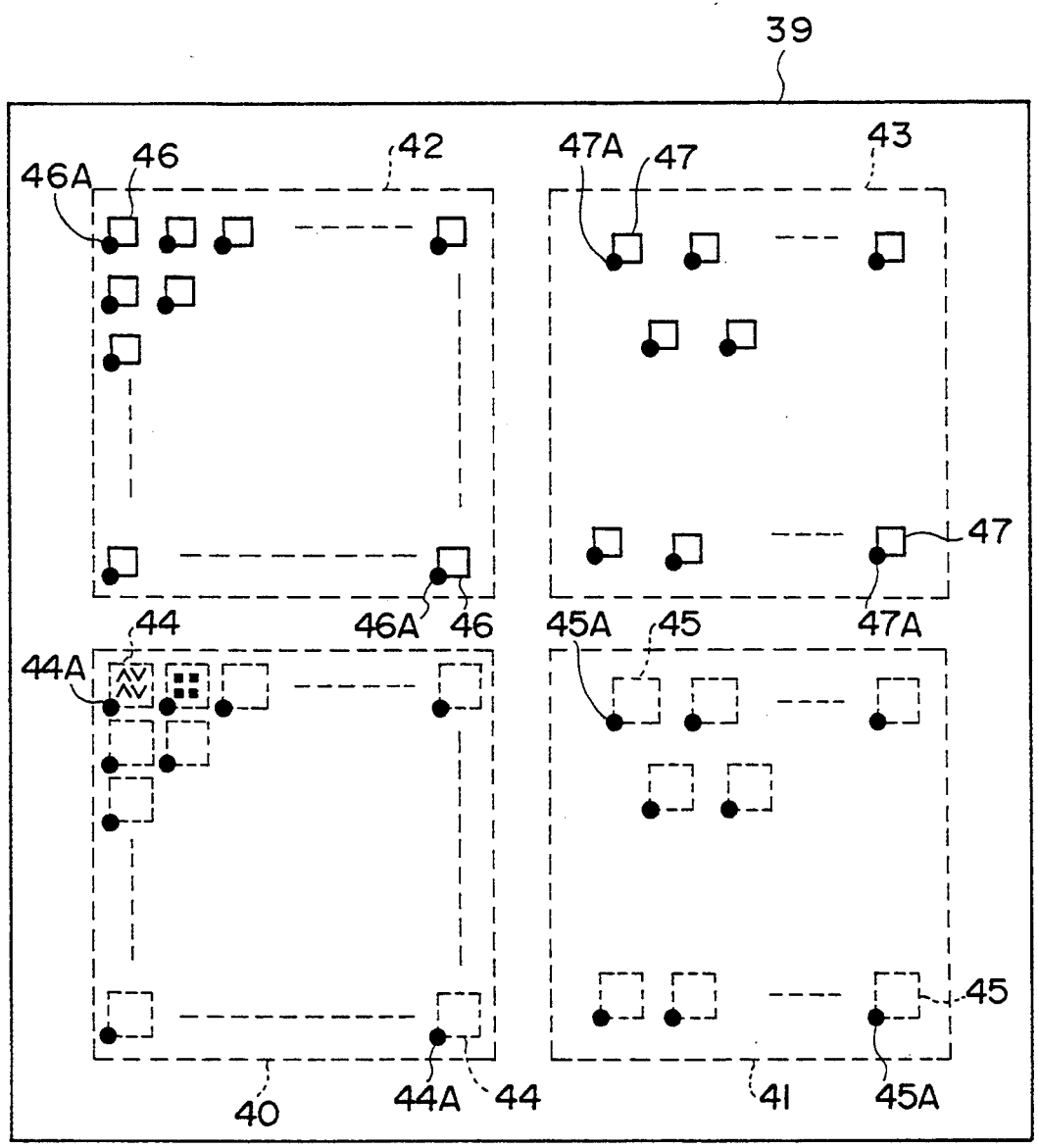
FIG. 7 is a plan view of a transparent mask plate according to a second embodiment of the present invention.

FIG. 7 is a plan view of a transparent mask plate according to a second embodiment of the present invention. The transparent mask plate is made up of a base plate 39, exposure pattern areas 40 and 41, and calibration areas 43 respectively related to the exposure pattern areas 40 and 41. A plurality of transparent patterns 44 arranged in rows and columns are formed in the exposure pattern area 40. A reference number 44A indicates a reference point of each of the transparent patterns 44. A plurality of transparent patterns 45 arranged in rows and columns are formed in the exposure pattern area 41. A reference number 45A indicates a reference point of each of the transparent patterns 45. A plurality of transparent patterns 46 arranged in rows and columns are formed in the calibration area 42. A reference number 46A indicates a reference point of each of the transparent patterns 46. A plurality of transparent patterns 47 arranged in rows and columns are formed in the calibration area 43. A reference number 47A indicates a reference point of each of the transparent patterns 47.

The transparent patterns 46 formed in the calibration area 42 are arranged at the same pitch as the transparent patterns 44 formed in the exposure pattern area 40. Each of the transparent patterns 46 corresponds to one of the transparent patterns 44. Further, the reference points 46A of the transparent patterns 46 in the calibration area 42 correspond to the reference points 44A of the transparent patterns 44. The transparent patterns 47 formed in the calibration area 43 are arranged at the same pitch as the transparent patterns 45 formed in the exposure pattern area 41. Each of the transparent patterns 47 corresponds to one of the transparent patterns 45. Further, the reference points 47A of the transparent patterns 47 in the calibration area 43 correspond to the reference points 45A of the transparent patterns 45. Hence, the mask deflector conditions respectively obtained for the transparent patterns 46 in the calibration area 42 can be applied to the transparent patterns 44 without modification. Further, the mask deflector conditions respectively obtained for the transparent patterns 47 in the calibration area 43 can be applied to the transparent patterns 45 without modification.

The mask deflector conditions respectively obtained for the transparent patterns 46 are stored in connection with the corresponding transparent patterns 44. Similarly, the mask deflector conditions respectively obtained for the transparent patterns 47 are stored in connection with the corresponding transparent patterns 45. Hence, it is possible to accurately deflect the electron beam on the basis of the mask deflector condition corresponding to the selected exposure pattern.

Figure 8:
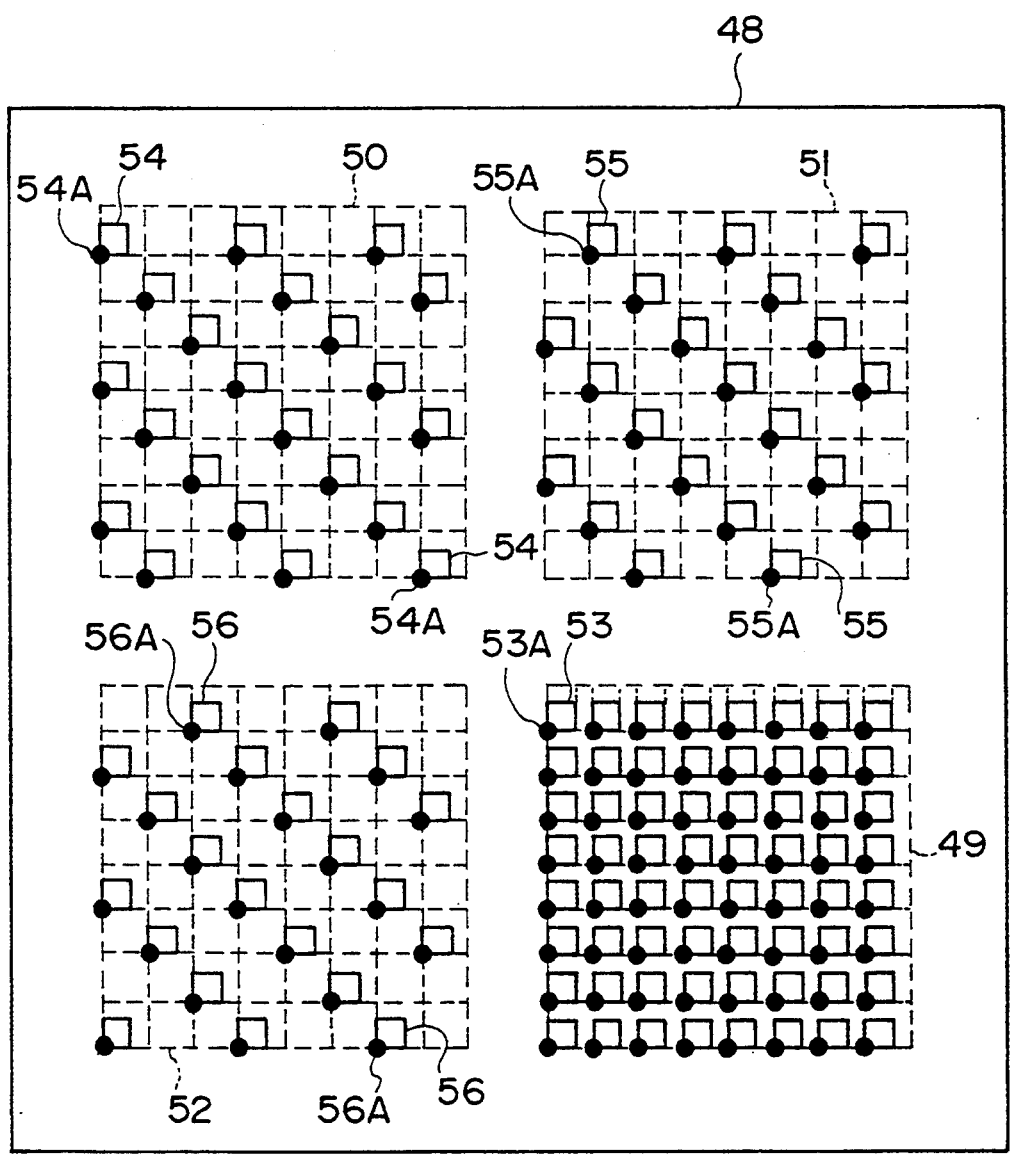
FIG. 8 is a plan view of a transparent mask plate according to a third embodiment of the present invention.

FIG. 8 is a plan view of a transparent mask plate according to a third embodiment of the present invention. The transparent mask plate is made up of a base plate 48, an exposure pattern area 49, and three calibration areas 50, 51 and 52 related to the exposure pattern area 49. A plurality of transparent patterns 53 arranged in rows and columns are formed in the exposure pattern area 49. A reference number 53A indicates a reference point of each of the transparent patterns 53. A plurality of transparent patterns 54 arranged in rows and columns are formed in the calibration area 50. A reference number 54A indicates a reference point of each of the transparent patterns 54. A plurality of transparent patterns 55 arranged in rows and columns are formed in the calibration area 51. A reference number 55A indicates a reference point of each of the transparent patterns 55. A plurality of transparent patterns 56 arranged in rows and columns are formed in the calibration area 52. A reference number 56A indicates a reference point of each of the transparent patterns 56.

The transparent patterns 54 in the calibration area 50 are arranged with a pitch greater than that of the transparent patterns 53. The transparent patterns 55 in the calibration area 51 are arranged at the same pitch as that of the transparent patterns 54. The transparent patterns 56 in the calibration area 52 are arranged at the same pitch as that of the transparent patterns 54.

Figure 9:
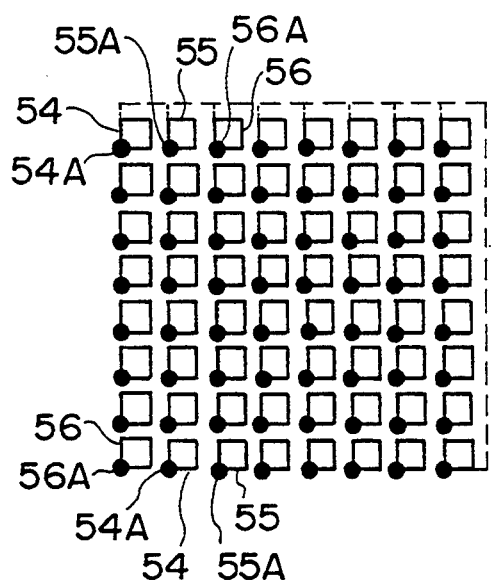
FIG. 9 is a plan view for explaining the third embodiment of the present invention.

When the calibration areas 50, 51 and 52 are provided in layers, a unified calibration area shown in FIG. 9 is obtained. The transparent patterns 54, 55 and 56 formed in the unified calibration area are arranged with the same pitch as the transparent patterns 53 formed in the exposure pattern area 49. Each of the transparent patterns 54, 55 and 56 corresponds to one of the transparent patterns 53. Further, each of the reference points 54A, 55A and 56A of the transparent patterns 54, 55 and 56 in the unified calibration area correspond to one of the reference points 53A of the transparent patterns 53. In this regard, the transparent mask plate has three divided calibration areas 50, 51 and 52. Hence, the mask deflector conditions respectively obtained for the transparent patterns 54, 55 and 56 in the calibration area 50, 51 and 52 can be applied to the transparent patterns 53 in the exposure pattern area 49 without modification. The mask deflector conditions respectively obtained for the transparent patterns 54, 55 and 56 are stored in connection with the corresponding transparent patterns 53. Hence, it is possible to accurately deflect the electron beam to a selected exposure pattern and to perform highly-precise exposure. Further, it is possible to form the transparent patterns 53 with a high density because the transparent mask plate has the three divided calibration areas 50, 51 and 52.

Figure 10:
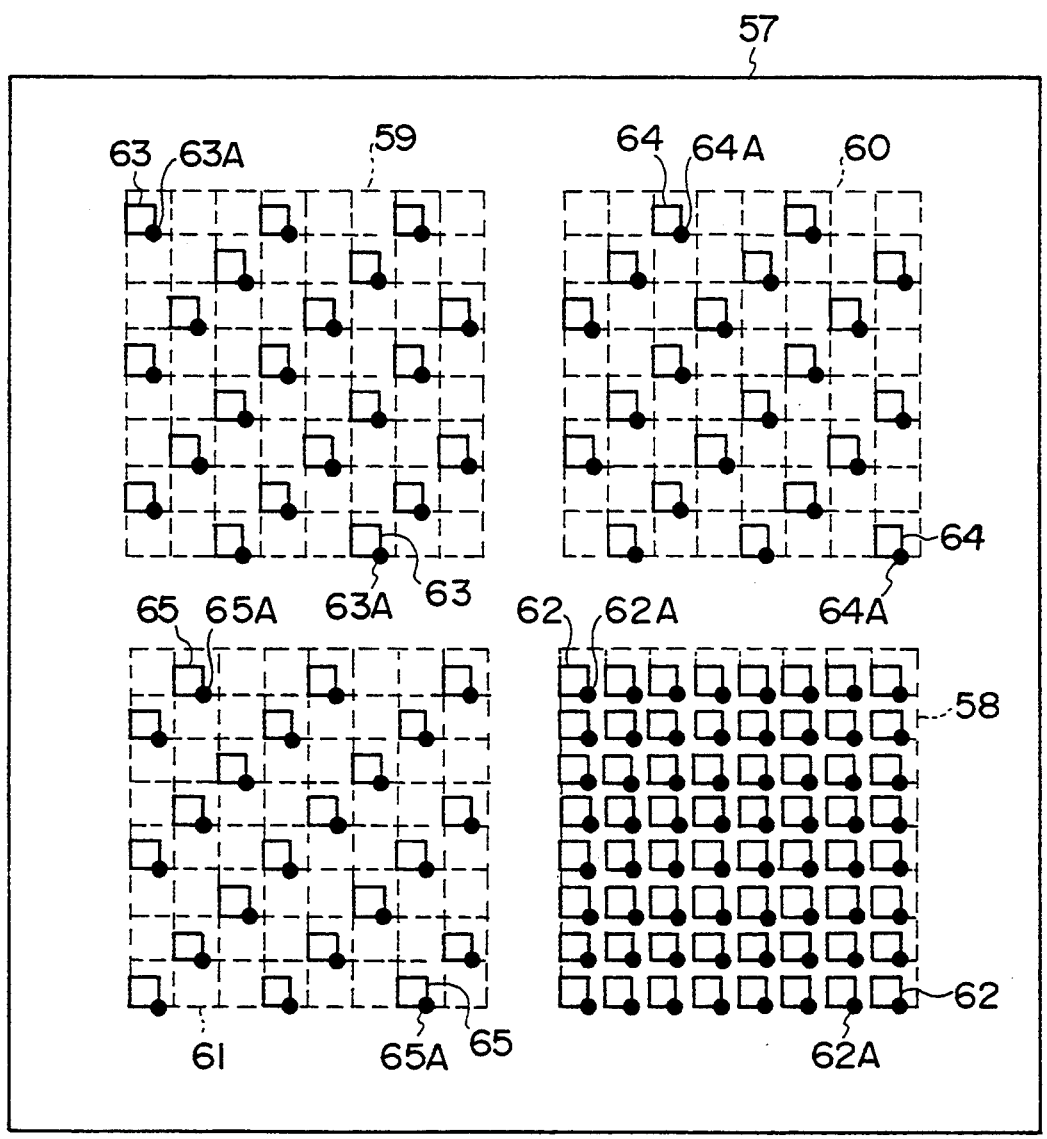
FIG. 10 is a plan view of a transparent mask pattern according to a fourth embodiment of the present invention.

FIG. 10 is a plan view of a transparent mask plate according to a fourth embodiment of the present invention. The transparent mask plate is made up of a base plate 57, an exposure pattern area 58, and three calibration areas 59, 60 and 61 related to the exposure pattern area 58. A plurality of transparent patterns 62 arranged in rows and columns are formed in the exposure pattern area 58. A reference number 62A indicates a reference point of each of the transparent patterns 58. A plurality of transparent patterns 63 arranged in rows and columns are formed in the calibration area 59. A reference number 63A indicates a reference point of each of the transparent patterns 63. A plurality of transparent patterns 64 arranged in rows and columns are formed in the calibration area 60. A reference number 64A indicates a reference point of each of the transparent patterns 64. A plurality of transparent patterns 65 arranged in rows and columns are formed in the calibration area 61. A reference number 65A indicates a reference point of each of the transparent patterns 65.

It will be noted that the reference points 62A, 63A, 64A and 65A are located at positions different from those of the reference points 53A, 54A, 55A and 56A shown in FIG. 8.

The transparent patterns 63 in the calibration area 59 are arranged with a pitch greater than that of the transparent patterns 62. The transparent patterns 64 in the calibration area 60 are arranged at the same pitch as that of the transparent patterns 63. The transparent patterns 65 in the calibration area 61 are arranged at the same pitch as that of the transparent patterns 63.

Figure 11:
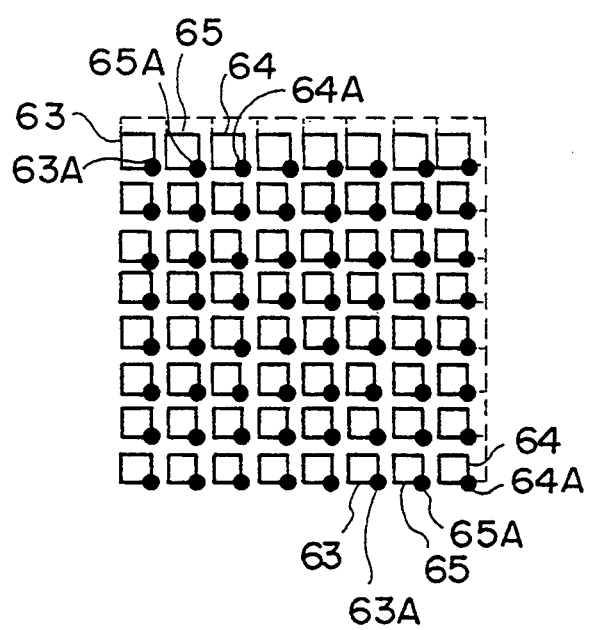
FIG. 11 is a plan view for explaining the fourth embodiment of the present invention.

When the calibration areas 59, 60 and 61 are put in layers, a unified calibration area shown in FIG. 11 is obtained. The transparent patterns 63, 64 and 65 formed in the unified calibration area are arranged at the same pitch as the transparent patterns 62 formed in the exposure pattern area 58. Each of the transparent patterns 63, 64 and 65 corresponds to one of the transparent patterns 62. Further, each of the reference points 63A, 64A and 65A of the transparent patterns 63, 64 and 65 in the unified calibration area corresponds to one of the reference points 62A of the transparent patterns 62. In this regard, the transparent mask plate shown in FIG. 10 has three divided calibration areas 59, 60 and 61. Hence, the mask deflector conditions respectively obtained for the transparent patterns 63, 64 and 65 in the calibration area 59, 610 and 61 can be applied to the transparent patterns 62 in the exposure pattern area 58 without modification. The mask deflector conditions respectively obtained for the transparent patterns 63, 64 and 65 are stored in connection with the corresponding transparent patterns 62. Hence, it is possible to accurately deflect the electron beam to a selected exposure pattern and to perform highly-precise exposure. Further, it is possible to form the transparent patterns 62 with a high density because the transparent mask plate according to the fourth embodiment has the three divided calibration areas 59, 60 and 61.

Figure 12:
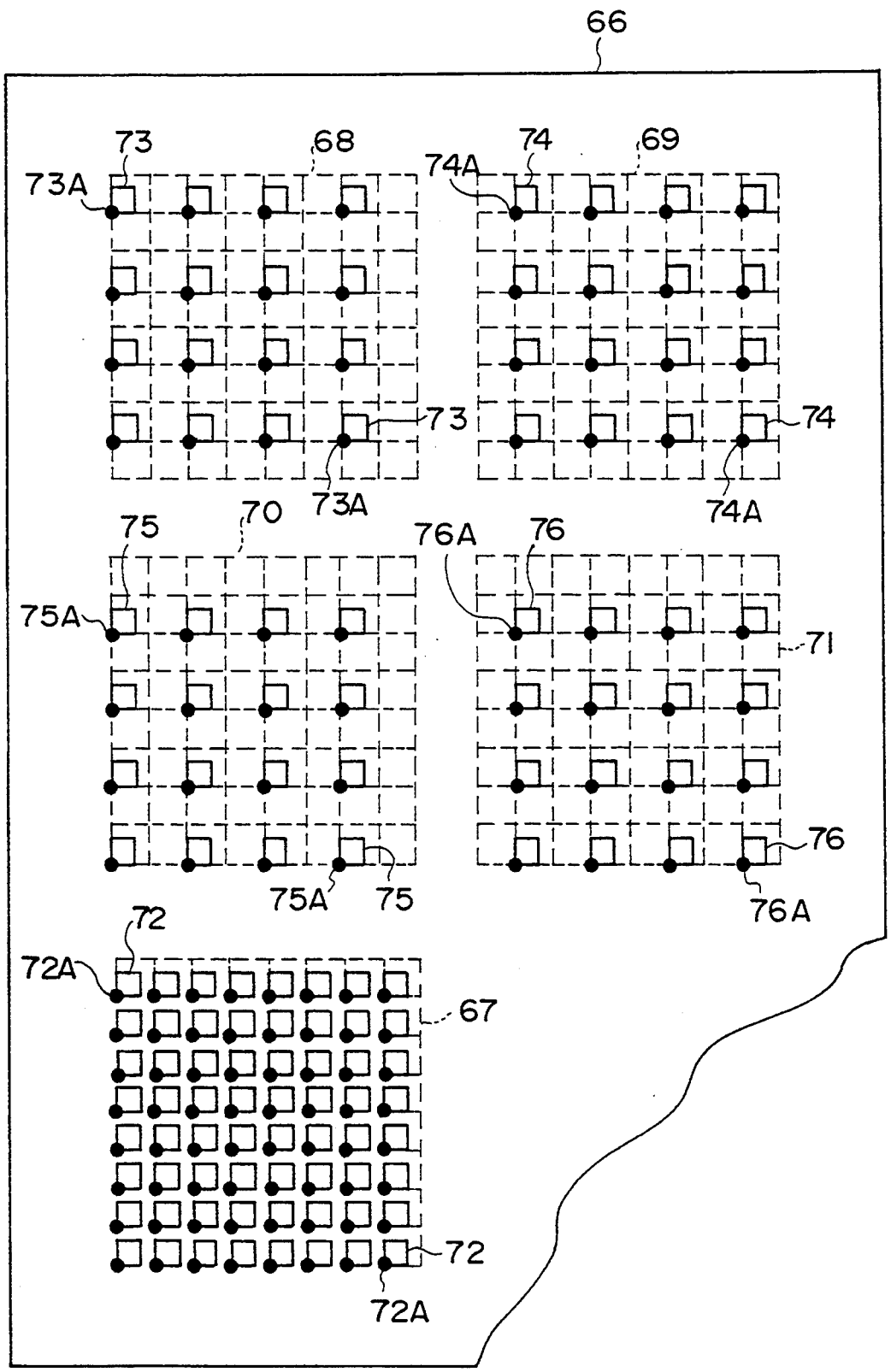
FIG. 12 is a plan view of a transparent mask pattern according to a fifth embodiment of the present invention.

FIG. 12 is a plan view of a transparent mask plate according to a fifth embodiment of the present invention. The transparent mask plate shown in FIG. 12 is made up of a base plate 66, an exposure pattern area 67, and four calibration areas 68, 69, 70 and 71 related to the exposure pattern area 67.

A plurality of transparent patterns 72 arranged in rows and columns are formed in the exposure pattern area 67. A reference number 72A indicates a reference point of each of the transparent patterns 72. A plurality of transparent patterns 73 arranged in rows and columns are formed in the calibration area 68. A reference number 73A indicates a reference point of each of the transparent patterns 68. A plurality of transparent patterns 74 arranged in rows and columns are formed in the calibration area 69. A reference number 74A indicates a reference point of each of the transparent patterns 74. A plurality of transparent patterns 75 arranged in rows and columns are formed in the calibration area 70. A reference number 75A indicates a reference point of each of the transparent patterns 75. A plurality of transparent patterns 76 arranged in rows and columns are formed in the calibration area 71. A reference number 76A indicates a reference point of each of the transparent patterns 76.

The transparent patterns 73 in the calibration area 68 are arranged at a pitch greater than that of the transparent patterns 72 in the exposure pattern area 67. The transparent patterns 74 in the calibration area 69 are arranged at the same pitch as that of the transparent patterns 73. The transparent patterns 75 in the calibration area 70 are arranged at the same pitch as that of the transparent patterns 73. The transparent patterns 76 in the calibration area 71 are arranged at the same pitch as that of the transparent patterns 73.

Figure 13:
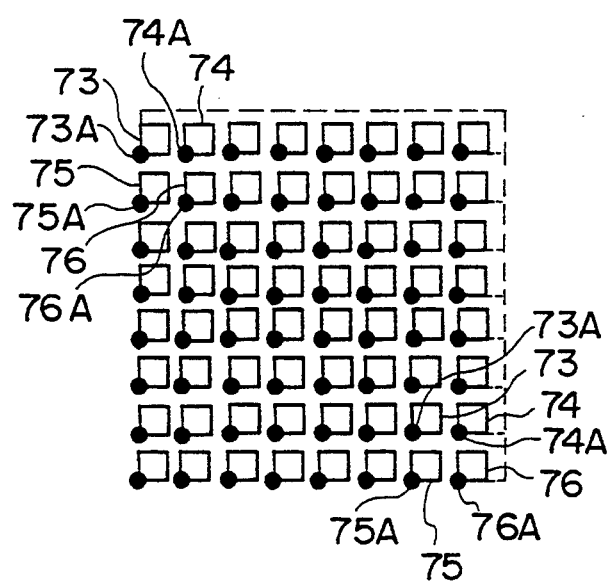
FIG. 13 is a plan view for explaining the fifth embodiment of the present invention.

When the calibration areas 68, 69, 70 and 71 are provided in layers, a unified calibration area shown in FIG. 13 is obtained. The transparent patterns 73, 74, 75 and 76 formed in the unified calibration area are arranged at the same pitch as the transparent patterns 72 formed in the exposure pattern area 67. Each of the transparent patterns 73, 74, 75 and 76 corresponds to one of the transparent patterns 72. Further, each of the reference points 73A, 74A, 75A and 76A of the transparent patterns 73, 74, 75 and 76 in the unified calibration area corresponds to one of the reference points 72A of the transparent patterns 72. In this regard, the transparent mask plate shown in FIG. 12 has four divided calibration areas 68, 69, 70 and 71. Hence, the mask deflector conditions respectively obtained for the transparent patterns 73, 74, 75 and 76 in the calibration area 68, 69, 70 and 71 can be applied to the transparent patterns 72 in the exposure pattern area 67 as per se. The mask deflector conditions respectively obtained for the transparent patterns 73, 74, 75 and 76 are stored in connection with the corresponding transparent patterns 72. Hence, it is possible to accurately deflect the electron beam to a selected exposure pattern and to perform highly-precise exposure. Further, it is possible to form the transparent patterns 72 at a high density because the transparent mask plate according to the fourth embodiment has the four divided calibration areas 68, 69, 70 and 71.

Figure 14:
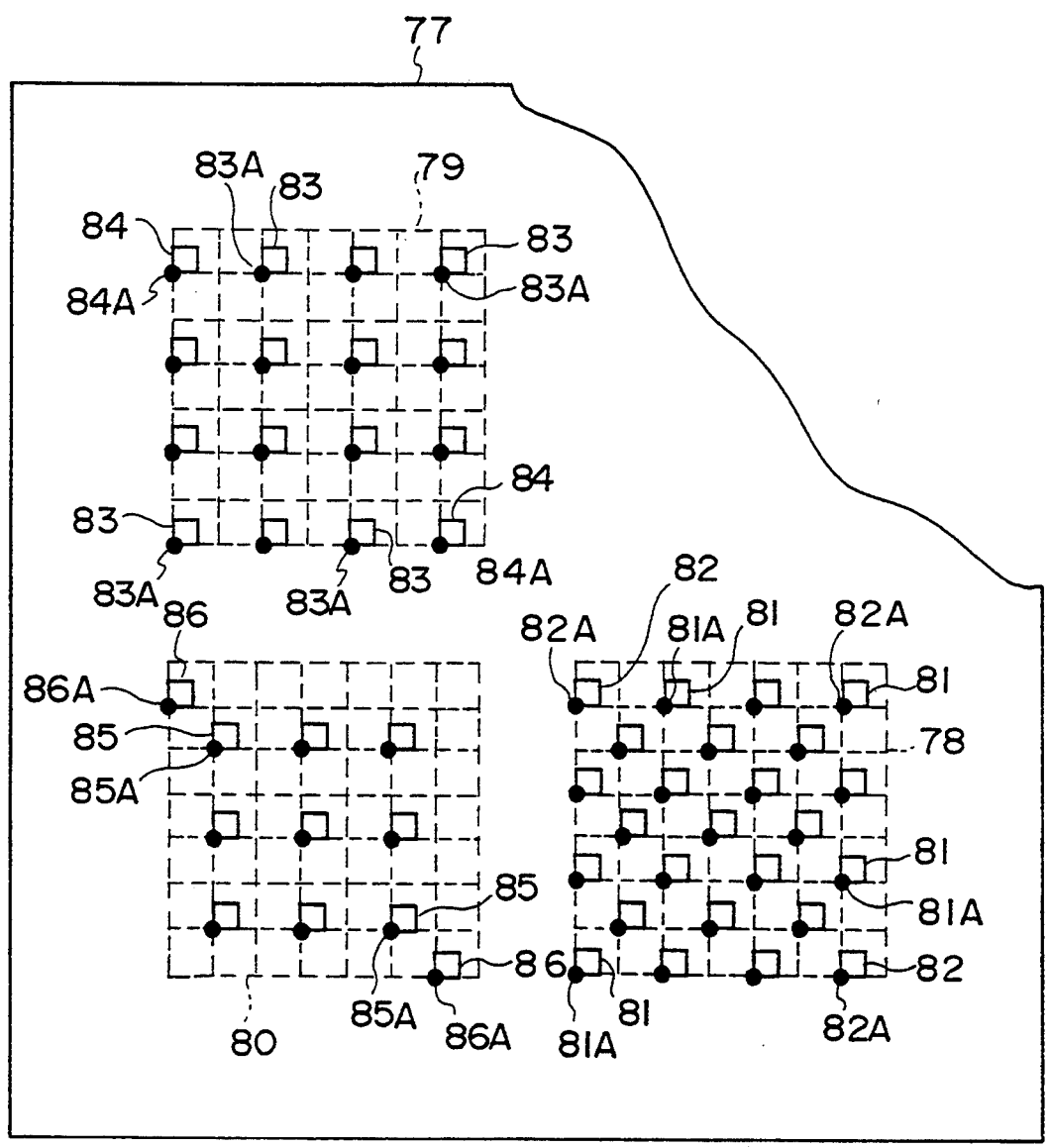
FIG. 14 is a plan view of a transparent mask plate according to a sixth embodiment of the present invention.

FIG. 14 is a plan view of a transparent mask pattern according to a sixth embodiment of the present invention. According to the sixth embodiment of the present invention, two transparent patterns for correctly positioning the transparent mask plate to hence position the desired area are provided for each area.

More specifically, the transparent mask pattern shown in FIG. 14 is made up of a base plate 77, an exposure pattern area 78 and two calibration areas 79 and 80. A plurality of transparent patterns 81 arranged in rows and columns are formed in the exposure pattern area 78. A reference number 81A indicates a reference point of each of the transparent patterns 81. Further, two transparent patterns 82 are provided in the exposure pattern area 78. One of the two transparent patterns 82 is located at the upper left corner of the area 78, and the other transparent pattern 82 is located at the lower right corner thereof. In other words, the two transparent patterns 82 are located on a diagonal of the area 78.

A plurality of transparent patterns 83 arranged in rows and columns are formed in the calibration area 79. A reference number 83A indicates a reference point of each of the transparent patterns 83. Further, two transparent patterns 84 are provided in the calibration area 79. One of the two transparent patterns 84 is located at the upper left corner of the area 79, and the other transparent pattern 84 is located at the lower right corner thereof. In other words, the two transparent patterns 84 are located on the same diagonal as the two transparent patterns 82 formed in the exposure pattern area 78.

A plurality of transparent patterns 85 arranged in rows and columns are formed in the calibration area 80. A reference number 85A indicates a reference point of each of the transparent patterns 85. Further, two transparent patterns 86 are provided in the calibration area 80. One of the two transparent patterns 86 is located at the upper left corner of the area 80, and the other transparent pattern 86 is located at the lower right corner thereof. In other words, the two transparent patterns 86 are located on the same diagonal as the transparent patterns 82 and 84 formed in the areas 78 and 79. It will be noted that the positioning of each of the areas 78–80 on a plane can be correctly performed by using only two transparent patterns.

The transparent patterns 83 and 84 in the calibration area 79 are arranged at a pitch greater than that of the transparent patterns 81 and 82 in the exposure pattern area 78. The transparent patterns 85 and 86 in the calibration area 80 are arranged at a pitch greater than that of the transparent patterns 81 and 82.

Figure 15:
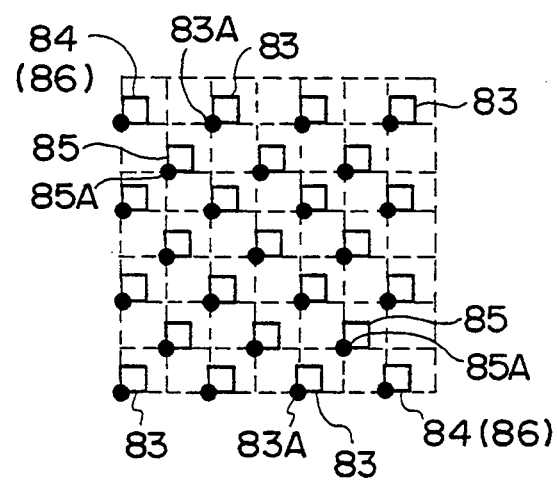
FIG. 15 is a plan view for explaining the sixth embodiment of the present invention.

When the calibration areas 79 and 80 are put in layers, a unified calibration area shown in FIG. 15 is obtained. The transparent patterns 83, 84, 85 and 86 formed in the unified calibration area are arranged at the same pitch as the transparent patterns 81 and 82 formed in the exposure pattern area 78. Each of the transparent patterns 83–86 corresponds to one of the transparent patterns 81 and 82. Further, each of the reference points 83A, 84A, 85A and 86A of the transparent patterns 83, 84, 85 and 86 in the unified calibration area corresponds to one of the reference points 81A and 82A of the transparent patterns 81 and 82. In this regard, the transparent mask plate shown in FIG. 14 has two divided calibration areas 79 and 80. Hence, the mask deflector conditions respectively obtained for the transparent patterns 83 and 85 in the calibration area 79 and 80 can be applied to the transparent patterns 81 in the exposure pattern area 78 as per se. The mask deflector conditions respectively obtained for the transparent patterns 83 and 85 are stored in connection with the corresponding transparent patterns 81. Hence, it is possible to accurately deflect the electron beam to a selected exposure pattern and to perform highly-precise exposure. Further, it is possible to form the transparent patterns 81 at a high density because the transparent mask plate according to the fourth embodiment has the two divided calibration areas 79 and 80.

The transparent patterns can be provided in the first through fifth embodiments of the present invention. For example, the transparent patterns 38 located at the upper left corner of each of the areas 31–34 shown in FIG. 6 and located at the lower right corner thereof are replaced by transparent patterns for positioning.

The present invention is not limited to the specifically disclosed embodiments, and variations and modifications may be made without departing from the scope of the present invention.

What is claimed is:

1. A transparent mask plate used in a charged particle beam exposure apparatus comprising:
   a base plate;
   an exposure pattern area formed in the base plate, the exposure pattern area having a plurality of transparent patterns for shaping a cross section of a charged particle beam into a block pattern; and
   a calibration area formed in the base plate, the calibration area having a plurality of transparent patterns used for obtaining a condition for deflecting the charged particle beam,
   the plurality of transparent patterns formed in the calibration area being arranged with the same pitch as the plurality of transparent patterns formed in the exposure pattern area,
   each of the plurality of transparent patterns formed in the calibration area corresponding to one of the plurality of transparent patterns formed in the exposure pattern area.

2. The exposure mask plate as claimed in claim 1, wherein the plurality of transparent patterns formed in the calibration area are located at the same arrangement positions as the plurality of transparent patterns formed in the exposure pattern area.

3. The exposure mask plate as claimed in claim 1, further comprising first transparent patterns formed in the calibration area and second transparent patterns formed in the exposure pattern area,
   the first transparent patterns being used to position the calibration area, and the second transparent patterns being used to position the exposure pattern area,
   the first transparent patterns being located at the same arrangement positions as the second transparent patterns.

4. The exposure mask plate as claimed in claim 1, wherein:
   the plurality of transparent patterns formed in the calibration area respectively have reference points used for deflecting the charged particle beam;
   the plurality of transparent patterns formed in the exposure pattern area respectively have reference points; and
   positions of the reference points of the plurality of transparent patterns formed in the calibration area coincide with positions of the reference points of the plurality of transparent patterns formed in the exposure pattern area.

5. A transparent mask plate used in a charged particle beam exposure apparatus comprising:
   a base plate;
   an exposure pattern area formed in the base plate, the exposure pattern area having a plurality of transparent patterns for shaping a cross section of a charged particle beam into a block pattern; and
   a plurality of calibration areas formed in the base plate, each of the calibration areas having a plurality of transparent patterns used to obtain a condition for deflecting the charged particle beam,
   the plurality of transparent patterns formed in each of the calibration areas being arranged with a pitch greater than that of the plurality of transparent patterns formed in the exposure pattern area,
   each of the plurality of transparent patterns formed in each of the calibration areas corresponding to one of the plurality of transparent patterns formed in the exposure pattern area.

6. The transparent mask plate as claimed in claim 5, wherein the transparent patterns formed in the plurality of calibration areas are arranged in the same pitch as that of the transparent patterns formed in the exposure pattern area in a case where the plurality of calibration areas are put in layers.

7. The transparent mask plate as claimed in claim 5, wherein the transparent patterns formed in the calibration areas are located at the same arrangement positions as the plurality of transparent patterns formed in the exposure pattern area in a case where the plurality of calibration areas are provided in layers.

8. The transparent mask plate as claimed in claim 5, further comprising first transparent patterns formed in each of the calibration areas, and second transparent patterns formed in the exposure pattern area,
   the first transparent patterns formed in each of the calibration areas being used to position the calibration area, and the second transparent patterns being used to position the exposure pattern area,
   the first transparent patterns formed in each of the calibration areas being located at the same arrangement positions as the second transparent patterns.

9. The transparent mask plate as claimed in claim 5, wherein:
   the plurality of transparent patterns formed in each of the calibration areas respectively have reference points used for deflecting the charged particle beam;
   the plurality of transparent patterns formed in the exposure pattern area respectively have reference points; and
   positions of the reference points of the plurality of transparent patterns formed in each of the calibration areas coincide with positions of the reference points of the plurality of transparent patterns formed in the exposure pattern area.

10. The transparent mask plate as claimed in claim 5, wherein the plurality of transparent patterns in the calibration areas are arranged with an identical pitch.

11. A charged particle beam exposure method for projecting a charged particle beam onto a wafer, said method comprising the steps of:
    (a) shaping a cross section of the charged particle beam into a rectangle;
    (b) deflecting the charged particle beam to a calibration area of a transparent mask plate,
    said transparent mask plate comprising: a base plate; an exposure pattern area formed in the base plate, the exposure pattern area having a plurality of transparent patterns for shaping the cross section of the charged particle beam into a block pattern; and said calibration area formed in the base plate, the calibration area having a plurality of transparent patterns used to obtain a condition for deflecting the charged particle beam, the plurality of transparent patterns formed in the calibration area being arranged with the same pitch as the plurality of transparent patterns formed in the exposure pattern area, each of the plurality of transparent patterns formed in the calibration area corresponding to one of the plurality of transparent patterns formed in the exposure pattern area;

(c) obtaining the condition for deflecting the charged particle beam by detecting the charged particle beam passing through the calibration area of the transparent mask; and (d) deflecting the charged particle beam to the exposure pattern area of the transparent mask plate on the basis of the condition for deflecting the charged particle beam obtained in said step (c).

12. The charged particle beam exposure method as claimed in claim 11, wherein the plurality of transparent patterns formed in the calibration area are located at the same arrangement positions as the plurality of transparent patterns formed in the exposure pattern area.

13. The charged particle beam exposure method as claimed in claim 11, wherein the transparent mask plate comprises first transparent patterns formed in the calibration area and second transparent patterns formed in the exposure pattern area, the first transparent patterns being used to position the calibration area, and the second transparent patterns being used to position the exposure pattern area, the first transparent patterns being located at the same arrangement positions as the second transparent patterns.

14. The charged particle beam exposure method as claimed in claim 11, wherein:

the plurality of transparent patterns formed in the calibration area respectively have reference points used for deflecting the charged particle beam;

the plurality of transparent patterns formed in the exposure pattern area respectively have reference points; and positions of the reference points of the plurality of transparent patterns formed in the calibration area coincide with positions of the reference points of the plurality of transparent patterns formed in the exposure pattern area.

15. A charged particle beam exposure method for projecting a charged particle beam onto a wafer, said method comprising the steps of:

(a) shaping a cross section of the charged particle beam into a rectangle;

(b) deflecting the charged particle beam to a calibration area of a transparent mask plate, said transparent mask plate comprising: a base plate; an exposure pattern area formed in the base plate, the exposure pattern area having a plurality of transparent patterns for shaping the cross section of the charged particle beam into a block pattern; and a plurality of calibration areas formed in the base plate, each of the calibration areas having a plurality of transparent patterns used to obtain a condition for deflecting the charged particle beam, the plurality of transparent patterns formed in each of the calibration areas being arranged with a pitch greater than that of the plurality of transparent patterns formed in the exposure pattern area, each of the plurality of transparent patterns formed in each of the calibration areas corresponding to one of the plurality of transparent patterns formed in the exposure pattern area;

(c) obtaining the condition for deflecting the charged particle beam by detecting the charged particle beam passing through the calibration area of the transparent mask; and (d) deflecting the charged particle beam to the exposure pattern area of the transparent mask plate on the basis of the condition for deflecting the charged particle beam obtained in said step (c).

16. The charged particle beam exposure method as claimed in claim 15, wherein the transparent patterns formed in the plurality of calibration areas are arranged in the same pitch as that of the transparent patterns formed in the exposure pattern area in a case where the plurality of calibration areas are put in layers.

17. The charged particle beam exposure method as claimed in claim 15, wherein the transparent patterns formed in the calibration areas are located at the same arrangement positions as the plurality of transparent patterns formed in the exposure pattern area in a case where the plurality of calibration areas are provided in layers.

18. The charged particle beam exposure method as claimed in claim 15, wherein the transparent mask plate comprises first transparent patterns formed in each of the calibration areas, and second transparent patterns formed in the exposure pattern area, the first transparent patterns formed in each of the calibration areas being used to position the calibration area, and the second transparent patterns being used to position the exposure pattern area, the first transparent patterns formed in each of the calibration areas being located at the same arrangement positions as the second transparent patterns.

19. The charged particle beam exposure method as claimed in claim 15, wherein:

the plurality of transparent patterns formed in each of the calibration areas respectively have reference points used for deflecting the charged particle beam;

the plurality of transparent patterns formed in the exposure pattern area respectively have reference points; and positions of the reference points of the plurality of transparent patterns formed in each of the calibration areas coincide with positions of the reference points of the plurality of transparent patterns formed in the exposure pattern area.

20. The charged particle beam exposure method as claimed in claim 15, wherein the plurality of transparent patterns in the calibration areas are arranged with an identical pitch.

* * * * *